United States Patent
Lee

[11] Patent Number: 5,250,459
[45] Date of Patent: Oct. 5, 1993

[54] ELECTRICALLY PROGRAMMABLE LOW RESISTIVE ANTIFUSE ELEMENT

[75] Inventor: Roger R. Lee, Boise, Id.

[73] Assignee: Micron Technology, Inc., Boise, Id.

[21] Appl. No.: 869,355

[22] Filed: Apr. 14, 1992

[51] Int. Cl.[5] .................... H01L 21/70; H01L 21/265
[52] U.S. Cl. ...................................... 437/52; 437/922; 437/191; 437/192; 437/195; 437/200
[58] Field of Search .............. 437/922, 43, 41, 48, 60, 437/52, 922, 60; 357/51, 23.5

[56] References Cited

U.S. PATENT DOCUMENTS

| | | | |
|---|---|---|---|
| 4,095,251 | 6/1978 | Dennard et al. | 437/41 |
| 4,505,027 | 3/1985 | Schwabe et al. | 437/41 |
| 4,682,409 | 7/1987 | Thomas et al. | 437/33 |
| 4,748,490 | 5/1988 | Hollingsworth | 357/51 |
| 4,899,205 | 2/1990 | Hamdy et al. | 357/51 |

OTHER PUBLICATIONS

Tanimoto et al. "A Novel 14V Programmable 4 kbit MOS PROM Using a Poly-Si Resistor Applicable to On-Chip Programmable Devices" IEEE Journal of Solid State Circuits, vol. SC-17 No. 1, Feb. 1982, pp. 62-66.

Primary Examiner—Robert Kunemund
Assistant Examiner—Loc Q. Trinh
Attorney, Agent, or Firm—David J. Paul

[57] ABSTRACT

The present invention introduces a process to fabricate very low resistive antifuse elements by introducing Antimony (Sb) into one or both of the antifuse element's electrodes and thereby resulting in said very low resistive (programmed) antifuse element. Introducing Sb into the antifuse electrode(s) reduces the depletion width of the dopant impurities thereby causing a large concentration of n+ dopants in the antifuse electrode(s). This allows a reduction in the voltage required across the electrodes to breakdown the inner lying dielectric and thus program or short the electrodes together. In addition, once the two electrodes become shorted together to form a filament, the Sb will flow form one or both electrode(s) and thereby heavily dope the filament itself with n+ atoms. With the presence of the heavy concentration of n+ atoms in the filament, the shorted antifuse element is reduced in resistance by as much as a few hundred ohms or below when compared to antifuse elements fabricated by other methods.

15 Claims, 3 Drawing Sheets

ELECTRICALLY PROGRAMMABLE LOW RESISTIVE ANTIFUSE ELEMENT

FIELD OF THE INVENTION

This invention relates to the field of semiconductor devices. More specifically, a process is described which allows fabrication of low resistive programmable antifuse elements used in integrated circuits (ICs), such as nonvolatile memory devices.

BACKGROUND OF THE INVENTION

While volatile memories, such as dynamic random access memories (DRAMs) provide a method to store information, many applications today make use of nonvolatile memories devices that will retain information even when power is removed.

Presently, virtually all nonvolatile memories are some type of read only memories (ROMs). One group of nonvolatile memories consists of ROMs in which data is entered during manufacturing that cannot be subsequently altered. These devices are known as masked ROMS. Another group of nonvolatile memories consists of memories whose data can be entered by the user. This group is known as a programmable ROM or PROM in which data can only be entered once.

There is one common element among the programmable structures that reside in PROMS, and a RAM having programmable options available and that is the need for an internal programmable element.

In recent years, programmable antifuse elements have been developed for use in various integrated circuit applications (such as the antifuse element disclosed in U.S. Pat. No. 4,899,205, herein incorporated by reference). In order to be able for an antifuse element to be incorporated into state-of-the-art IC fabrication, a low, voltage, low current antifuse element is essential. In addition, a low resistive post programming behavior is important in order to distinguish between "on" and "off" states (or "programmed" and "unprogrammed" states).

SUMMARY OF THE INVENTION

The present invention introduces a process to fabricate very low resistive antifuse elements by introducing Antimony (Sb) into one or both of the antifuse element's electrodes thereby resulting in said very low resistive (programmed) antifuse element.

Introducing Sb into one or both antifuse electrodes reduces the depletion width of the dopant impurities thereby causing a more concentrated n+ dopants in the antifuse electrode. This allows a reduction in the voltage drop required across the electrode(s) to breakdown the inner lying dielectric and thus program or short the electrodes together. In addition, once the two electrodes become shorted together to form a filament, the Sb will flow from one or both electrode(s) and thereby heavily dope the filament itself with n+ atoms. With the presence of the heavy concentration of n+ atoms in the filament, the shorted antifuse element may be reduced in resistance to a few hundred ohms or below when compared to antifuse elements fabricated by other methods.

DETAILED DESCRIPTION OF THE PREFERRED EMBODIMENTS

Figure 1:
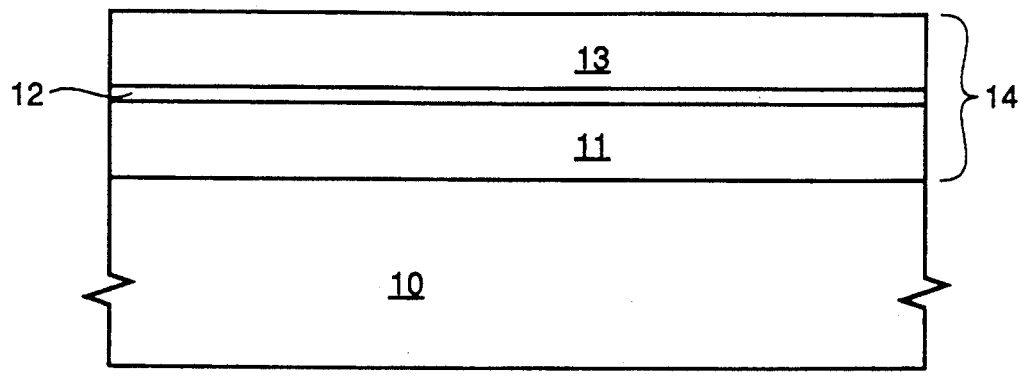
FIG. 1 is a composite cross-sectional view depicting a typical antifuse element.

FIG. 1 depicts a typical antifuse element 14 comprising a first antifuse electrode 11, antifuse dielectric layer 12 and second antifuse electrode 13, which have been fabricated on substrate 10. As will be readily recognized by one skilled in the art, substrate 10 may be construed as any region dictated by a given fabrication process whereon an antifuse element is desired to be constructed. For example, substrate 10, may be a region having a first conductivity type formed within a starting substrate or the starting substrate itself (such as silicon).

Figure 2A:
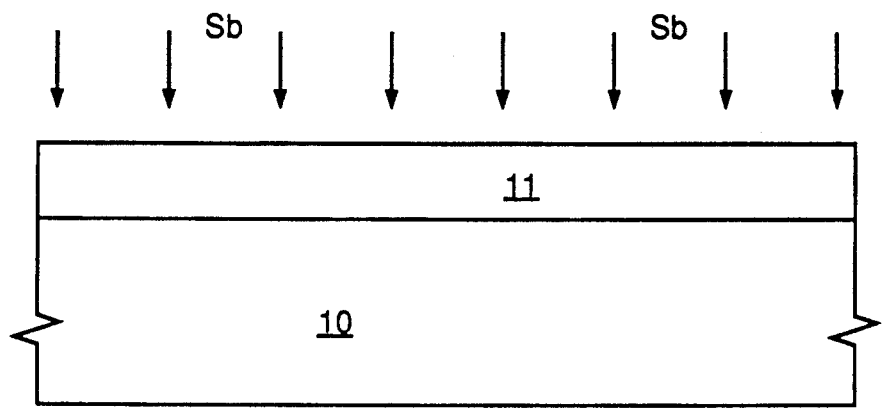
FIGS. 2a and 2b are composite cross-sectional views depicting an antifuse element wherein Antimony is introduced into the lower antifuse electrode.
Figure 2B:
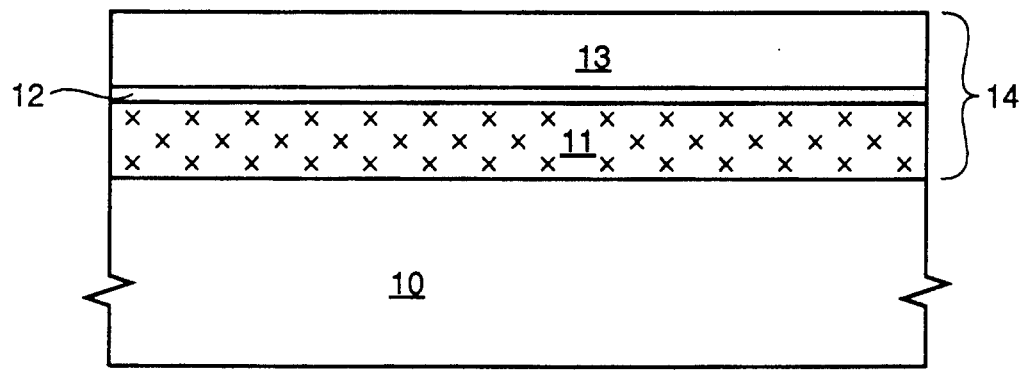

A first embodiment of the present invention is illustrated in FIGS. 2a and 2b. Referring now to FIG. 2a, a first antifuse electrode 11 has been formed on substrate 10 by conventional process steps. It is preferred that electrode 11 be n-type conductively doped polysilicon in which, at this point, is doped in accordance with the present invention whereby a heavy concentration of Antimony (Sb) of approximately b $10^{18}$ to $10^{20}/cm^3$ is introduced into electrode 11. The Sb doping can be accomplished by insitu during formation of electrode 11, or implanted thereafter, or by Low Pressure Chemical Vapor Deposition (LPCVD).

Referring now FIG. 2b, antifuse dielectric 12 is formed overlying electrode 11. Next, second antifuse electrode 13 (n-type doped polysilicon in this case) is placed overlying dielectric 12 to complete the formation of antifuse element 14. Electrode 11 is now very heavily doped with n+ atoms (due to the presence of the Sb dopant) which will reduce the depletion width in electrode 11 and in turn reduce the voltage drop across the depletion region and increase the effective electric field across antifuse 14 that is needed to rupture dielectric 12.

Figure 3A:
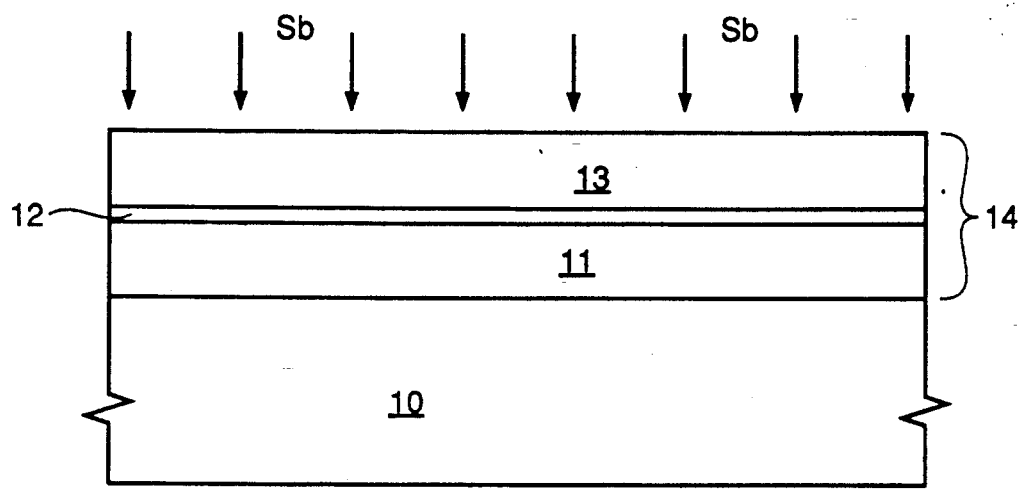
FIGS. 3a and 3b are composite cross-sectional views depicting an antifuse element wherein Antimony is introduced into the upper antifuse electrode.
Figure 3B:
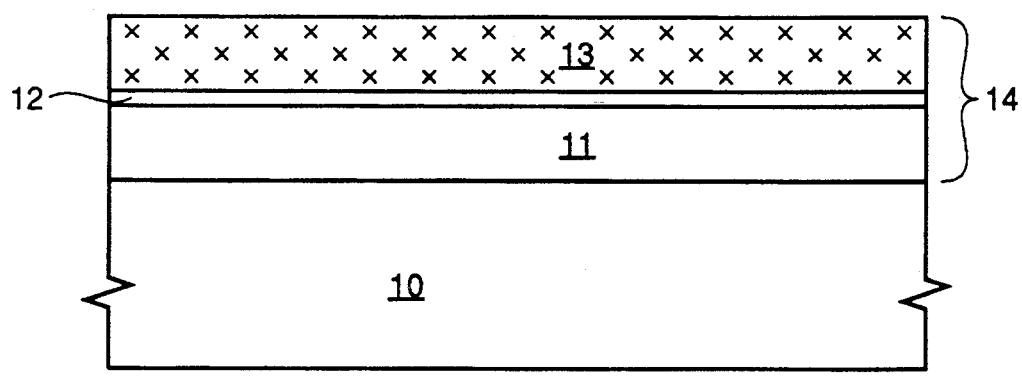

A second embodiment of the present invention is illustrated in FIGS. 3a and 3b. Referring now to FIG. 3a, antifuse element 14 comprising first antifuse electrode 11 (preferably n-type doped polysilicon), antifuse dielectric layer 12 and second antifuse electrode 13 (preferably n-type doped polysilicon), has been fabricated on substrate 10 by conventional process steps. At this point electrode 13 is doped in accordance with the present invention with a heavy concentration of Antimony (Sb) of approximately $10^{18}$ to $10^{20}/cm^3$. Again, only Sb atoms need be introduced into electrode 13 and the Sb doping can be accomplished by insitu during formation of electrode 13 or implanted thereafter, or by Low Pressure Chemical Vapor Deposition (LPCVD).

As FIG. 3b shows, electrode 13 of completed antifuse element 14 is now very heavily doped with n+ atoms (due to the presence of the Sb dopant) which will reduce the depletion width in electrode 13 and in turn reduce the voltage drop across the depletion region and increase the effective voltage across antifuse 14 that is needed to rupture dielectric 12.

Figure 4A:
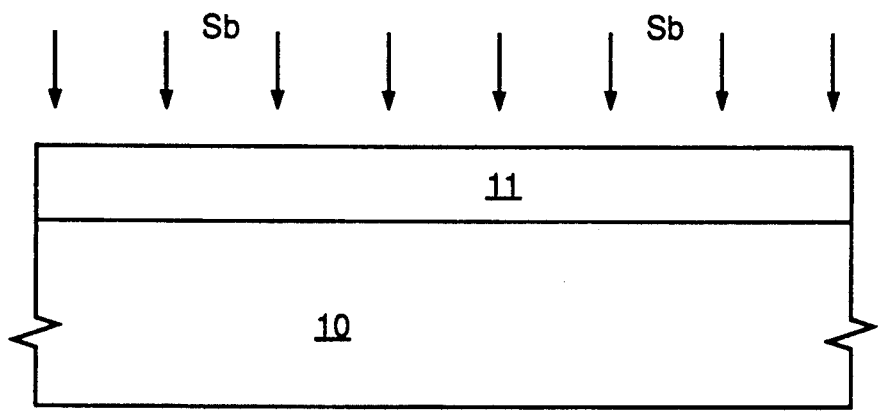
FIGS. 4a, 4b and 4c are composite cross-sectional views depicting an antifuse element wherein Antimony is introduced into both upper and lower antifuse electrodes.
Figure 4B:
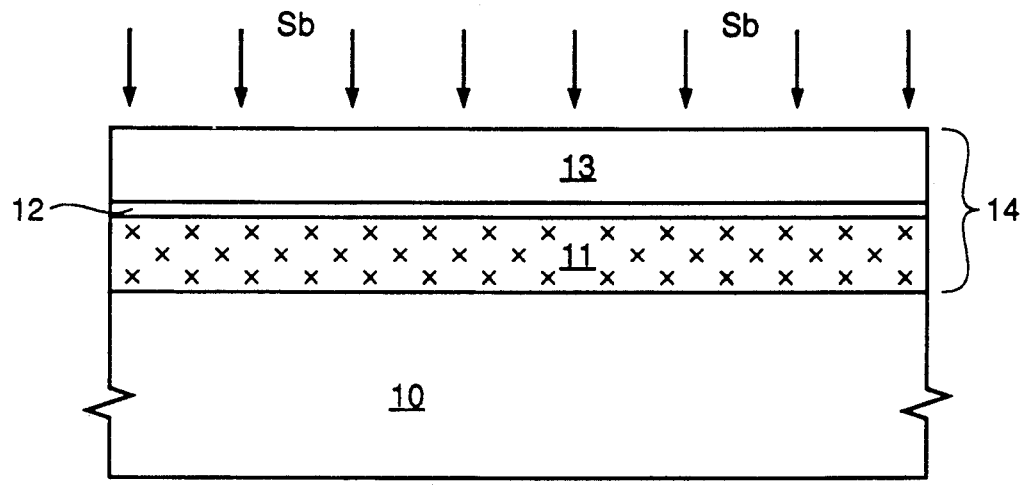
Figure 4C:
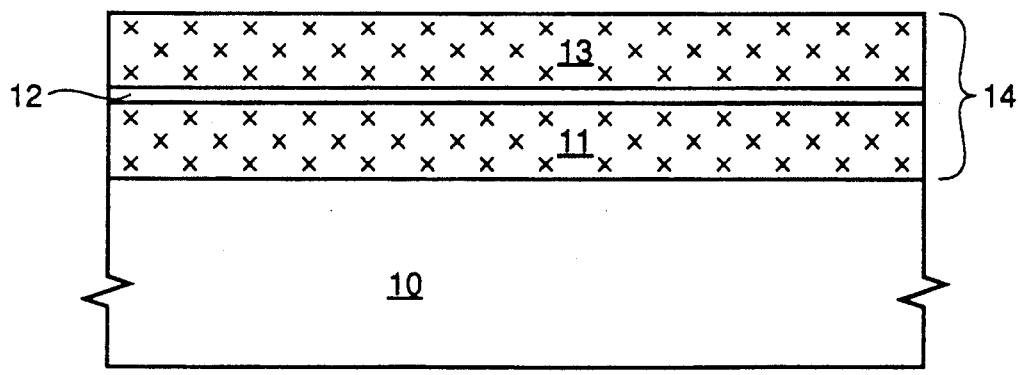

A third embodiment of the present invention is illustrated in FIGS. 4a-4c. Referring now to FIG. 4a, antifuse electrode 11 (preferably n-type doped polysilicon), has been fabricated on substrate 10 by conventional process steps. At this point electrode 11 is doped in accordance with the present invention with a heavy concentration of Antimony (Sb) of approximately $10^{18}$ to $10^{20}/cm^3$. Again, the Sb doping can be accomplished by insitu during formation of electrode 11 or implanted thereafter, or by Low Pressure Chemical Vapor Deposition (LPCVD).

Referring now to FIG. 4b, antifuse element 14 is further developed by conventional fabrication steps to comprise first antifuse electrode 11, antifuse dielectric layer 12 and second antifuse electrode 13 (preferably n-type doped polysilicon). At this point electrode 13 is doped in accordance with the present invention with a heavy concentration of Antimony (Sb) of approximately $10^{18}$ to $10^{20}/cm^3$. Again, only Sb atoms need be introduced into electrodes 11 and 13 and the Sb doping can be accomplished by insitu during formation of electrode 13 or implanted thereafter, or by Low Pressure Chemical Vapor Deposition (LPCVD).

As FIG. 4c shows, both electrodes 13 and 11 of completed antifuse element 14 are now very heavily doped with n+ atoms (due to the presence of the Sb dopant) which will reduce the depletion width in both electrodes 11 and 13 and in turn reduce the voltage drop across the depletion regions in both upper and lower electrodes and thereby increase the effective electric field across antifuse 14 that is needed to rupture dielectric 12.

Though it is preferred to have antifuse electrodes 11 and 13 comprise polysilicon or silicon that is doped n-type by such dopants as Arsenic (As) or Phosphorus (P) along with Antimony (Sb), the advantage of the present invention would also be accomplished by doping either one or both of the antifuse electrodes solely with Sb. In addition, if only one electrode is selected to be doped with Sb, the selected electrode could comprise either polysilicon or silicon or a combination thereof, while the remaining electrode may comprise metal or metal silicide or the like. For example, the upper electrode may comprise metal or metal silicide while the lower electrode may comprise Sb doped polysilicon or silicon.

It is to be understood that although the present invention has been described in several embodiments and in particular with reference to a specific embodiment, various modifications known to those skilled in the art, such as using this technique for other integrated circuits that utilize programmable antifuse structures, may be made to the method presented herein without departing from the invention as recited in the several claims appended hereto.

I claim:

1. A method of forming a programmable antifuse element fabricated on a substrate comprising the steps of:

a) forming a first conductive antifuse electrode;
b) forming an antifuse dielectric layer superjacent said first conductive electrode;
c) forming a second conductive antifuse electrode superjacent said antifuse dielectric layer;
d) selecting at least one of said conductive electrodes, wherein said selected electrode comprises an n-type dopant selected from the group consisting essentially of arsenic impurities and phosphorous impurities; and
e) introducing antimony impurities into said selected conductive electrode.

2. The method of claim 1 wherein said substrate comprises silicon.

3. The method of claim 1 wherein said first conductive electrode is n-type conductively doped polysilicon that is further doped with a concentration of Antimony atoms.

4. The method of claim 1 wherein said first conductive electrode is polysilicon that is solely doped with a concentration of Antimony atoms.

5. The method of claim 3 wherein said concentration of said Antimony atoms is in the range of approximately $10^{18}$ to $10^{20}/cm^3$.

6. The method of claim 4 wherein said concentration of said Antimony atoms is in the range of approximately $10^{18}$ to $10^{20}/cm^3$.

7. The method of claim 1 wherein said second conductive electrode is n-type conductively doped polysilicon that is further doped with a concentration of Antimony atoms.

8. The method of claim 1 wherein said second conductive electrode is polysilicon that is solely doped with a concentration of Antimony atoms.

9. The method of claim 7 wherein said concentration of said Antimony atoms is in the range of approximately $10^{18}$ to $10^{20}/cm^3$.

10. The method of claim 8 wherein said concentration of said Antimony atoms is in the range of approximately $10^{18}$ to $10^{20}/cm^3$.

11. The method of claim 1 wherein said first and second conductive electrodes are n-type conductively doped polysilicon layers that are further doped with a concentration of Antimony atoms.

12. The method of claim 1 wherein said first and second conductive electrodes comprise polysilicon layers that are solely doped with a concentration of Antimony atoms.

13. The method of claim 11 wherein said concentration of said Antimony atoms is in the range of approximately $10^{18}$ to $10^{20}/cm^3$.

14. The method of claim 12 wherein said concentration of said Antimony atoms is in the range of approximately $10^{18}$ to $10^{20}/cm^3$.

15. The method of claim 1 wherein said first and second antifuse electrodes comprise a material selected from the group consisting essentially of polysilicon, silicon, metal and metal silicide.

* * * * *